US006850132B2

(12) United States Patent
Jun et al.

(10) Patent No.: US 6,850,132 B2
(45) Date of Patent: Feb. 1, 2005

(54) S/N ENHANCER

(75) Inventors: Dong Suk Jun, Daejon-Shi (KR); Sang Seok Lee, Daejon-Shi (KR); Tae Goo Choy, Daejon-Shi (KR); Jin Woo Hahn, Daejon-Shi (KR); Dong Young Kim, Daejon-Shi (KR); Hong Yeol Lee, Choongchungbuk-Do (KR)

(73) Assignee: Electronics and Telecommunications Research Institute, Daejon-Shi (KR)

( * ) Notice: Subject to any disclaimer, the term of this patent is extended or adjusted under 35 U.S.C. 154(b) by 0 days.

(21) Appl. No.: 10/737,554

(22) Filed: Dec. 15, 2003

(65) Prior Publication Data

US 2004/0124947 A1 Jul. 1, 2004

Related U.S. Application Data

(62) Division of application No. 10/185,115, filed on Jun. 27, 2002.

(30) Foreign Application Priority Data

May 15, 2002 (KR) ........................................ 2002-26699

(51) Int. Cl.$^{7}$ .............................. H01P 1/20; H03H 7/34
(52) U.S. Cl. ........................................ 333/202; 333/201
(58) Field of Search ................................ 333/201, 202, 333/25, 109, 117

(56) References Cited

U.S. PATENT DOCUMENTS 5,523,725 A * 6/1996 Ishikawa et al. ........... 333/17.2
5,923,228 A 7/1999 Okada et al.

FOREIGN PATENT DOCUMENTS

JP 7-7445 A * 10/1995 ............. H01P/1/23

OTHER PUBLICATIONS

A Reflection Type of MSW Signal–To–Noise Enhancer in the 400–MHz Band by T. Kuki et al. 1995.

DBS Receiver with noise–reduction function using an MSW signal–to–noise enhancer by T. Nomoto et al. 1993.

A signal–to–noise enchancer using two MSSW filters and its application to noise reduction in DBS reception by T. Nomoto et al. 1993.

* cited by examiner

*Primary Examiner*—Benny Lee
*Assistant Examiner*—Dean Takaoka
(74) *Attorney, Agent, or Firm*—Blakely Sokoloff Taylor & Zafman

(57) ABSTRACT

A S/N enhancer using the magnetostatic wave signal. The S/N enhancer comprises a balun coupler for dividing an input signal into a first and second signals having the same power, the second signal having the phase difference of 180 degree with respect to the first signal; a saturation magnetostatic wave filter for receiving the first signal output from said balun coupler, converting that into a magnetostatic wave signal, and oppositely converting the magnetostatic wave signal, wherein the power of the magnetostatic wave signal is saturated if the first signal has the power of equal to and more than that of a noise signal; a linear magnetostatic wave filter for receiving the second signal from said balun coupler, converting that into a magnetostatic wave signal, and oppositely converting the magnetostatic wave signal, wherein the received second signal is converted into the magnetostatic wave signal having an energy linear to the power of the input signal; and a power synthesizer for synthesizing the respective signals output from said saturation magnetostatic wave filter and said linear magnetostatic wave filter.

5 Claims, 3 Drawing Sheets

S/N ENHANCER

The present patent application is a Divisional of application Ser. No. 10/185,115, filed Jun. 27, 2002.

BACKGROUND OF THE INVENTION

1. Field of the Invention

The present invention relates to a signal-to-noise (Hereinafter, referred to "S/N") enhancer, more particularly, a signal-to-noise enhancer that is implemented by using a balun coupler and a magnetostatic wave filter.

2. Description of the Prior Art

Recently, due to miniaturization of a digital broadcasting system, a satellite broadcasting system, a mobile communication system, a satellite communication system, a lightweight S/N enhancer that takes little cost is required. Also, in the characteristic aspect, the S/N enhancer having a low insertion loss, a high S/N ratio, a broadband, and low power consumption is required.

Hereinafter, a conventional S/N enhancer will be explained with reference to the accompanying drawings.

First, referring to FIG. 1, the S/N enhancer disclosed in "A Reflection type of MSW signal to noise enhancer in the 400 MHz band" of Takao Kuki and Toshihiro Nomoto, IEEE MTT-S digest vol. 41, No. 8, pp111–114, 1995 will be explained.

The S/N enhancer comprises a magnetostatic wave filter 10 and a directional coupler 12. The one end of the magneto static wave filter is connected with a circulator or a directional coupler that the input port and output port are separated. Explaining the principle thereof, when a RF signal having a small size thereof is applied to an input port, the signal is converted into a magnetostatic wave signal at an Yttrium-Iron-Garnet film. Therefore, the RF input signal is not output to the output port. Otherwise, when RF input signals equal to and more than a threshold value are applied to the input port, almost signals are reflected and output at the output port, without convert into the magnetostatic wave signals. Accordingly, the S/N enhancer that obtain a high loss when the signal has a small level and obtain a low loss when the signal has a large level be can be accomplished.

The above-mentioned S/N enhancer has merits which the structure thereof is simple and the input/output characteristics is excellent, but has demerits which the impedance matching as well as a large signal level is required.

Next, referring to FIG. 2, the S/N enhancer disclosed in "A signal to Noise Enhancer using two MSW filters and its application to Noise reduction in DBS reception" of Thoshihiro Nomoto and Yoshihiro Matsushita, IEEE Trans MTT vol. 41, No. 8, pp1316–1322, 1993. 8 will be explained.

The conventional S/N enhancer shown in FIG. 2 comprises magnetostatic wave filters 124 and 126, a phase shifter 136, an attenuator 134, and directional couplers 122 and 138. In principle, a first path signal and second path signal having different level are input to the directional coupler 122 and are distributed therein. Thereby, these two signals supplied to the magnetostatic wave filters 124 and 126, respectively. Where, while the first signal has a high level, the second signal has a low level. That is, the first signal includes a noise signal and a desired signal, wherein the noise signal passes through the magnetostatic wave filter 124, without being amplitude limited, but the desired signal is amplitude limited. In addition, the second signal has a noise signal and a desired signal which have both level lower than that of a saturation threshold power, thereby the noise level signal and the desired signal pass through the magnetostatic filter 126, without being amplitude limited.

Next, the directional coupler 138 synthesizes two path signals having the same amplitude and the opposite phase thereof with respect to the signal less than the threshold value. At the result, the noise signals are cancelled and the desired signal of the second signal becomes a main power level signal.

At this time, the level of the threshold power is in the range from—12 dBm (PH) to–19 dBm (PL), forming somewhat of a band. In addition, the attenuator 134 functions as a trimmer for compensating the power loss due to the phase shifter 136.

In the above-mentioned manner, there are merits which the input/output characteristics thereof is excellent and it is advantageous in the insertion loss, but there are demerits which it is can be not used at the low power.

SUMMARY OF THE INVENTION

Thus, the object of the present invention is to solve the problems of prior art and provide a S/N enhancer having a low insertion loss, a high S/N ratio, broadband.

In addition, another object of the present invention is to provide a small-sized S/N enhancer that can be easily matched with an external circuit in impedance and can be applicable to the system using the low power or the high power.

According to the one embodiment of the present invention, S/N enhancer comprising a balun coupler for receiving an first signal and dividing two second signals having the same power and the phase difference of 180 degree; a saturation magnetostatic wave filter for receiving one of the two second signals output from said balun coupler, converting that into a magnetostatic wave signal, and oppositely converting the magnetostatic wave signal, wherein the power of the magnetostatic wave signal is saturated if the received second signal has the power of equal to and more than that of a noise signal; a linear magnetostatic wave filter for receiving the other of the two second signals from said balun coupler, converting that into a magnetostatic wave signal, and oppositely converting the magnetostatic wave signal, wherein the received second signal is converted into the magnetostatic wave signal having an energy linear to the power of the input signal; and a power synthesizer for synthesizing the respective signals output from said saturation magnetostatic wave filter and said linear magnetostatic wave filter is provided.

According to another embodiment of the present invention, a S/N enhancer comprising a balun coupler for receiving an first signal and dividing two second signals having the same power and the phase difference of 180 degree; a saturation magnetostatic wave filter for receiving one of the two second signals output from said balun coupler, converting that into a magnetostatic wave signal, and oppositely converting the magnetostatic wave signal, wherein the power of the magnetostatic wave signal is saturated if the received second signal has the power of equal to and more than that of a noise signal; a delay line for transmitting the other of the two second signals output from said balun coupler; and a power synthesizer for synthesizing the respective signals output from said saturation magnetostatic wave filter and said linear magnetostatic wave filter is provided.

BRIEF DESCRIPTION OF THE ATTACHED DRAWINGS

The above and other objects, effects, features and advantages of the present invention will become more apparent by describing in detail the preferred embodiment of the present invention with reference to the attached drawings in which.

Figure 1:
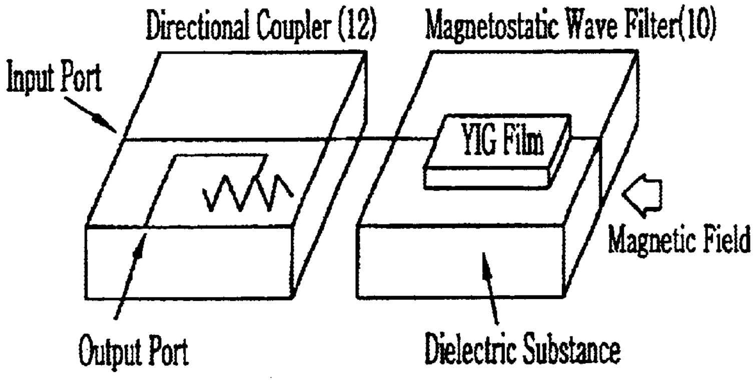
FIG.1 (PRIOR ART)
FIG. 1 is a schematic block diagram showing a conventional S/N enhancer.
Figure 2:
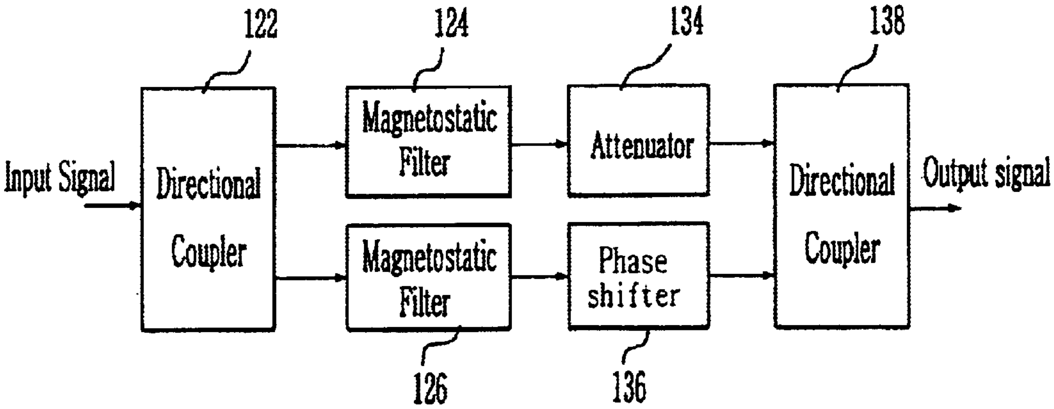
FIG.2 (PRIOR ART)
FIG. 2 is a schematic block diagram showing another conventional S/N enhancer.
Figure 3A:
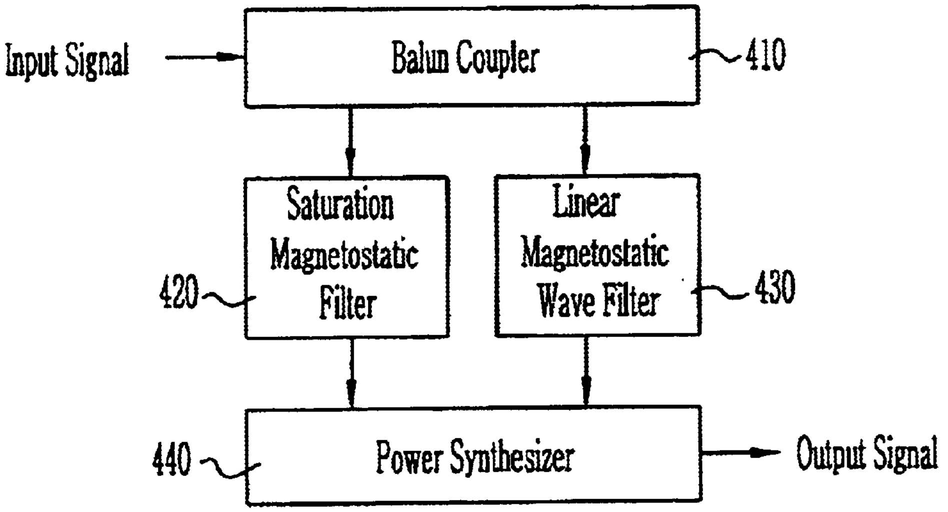
Figure 3B:
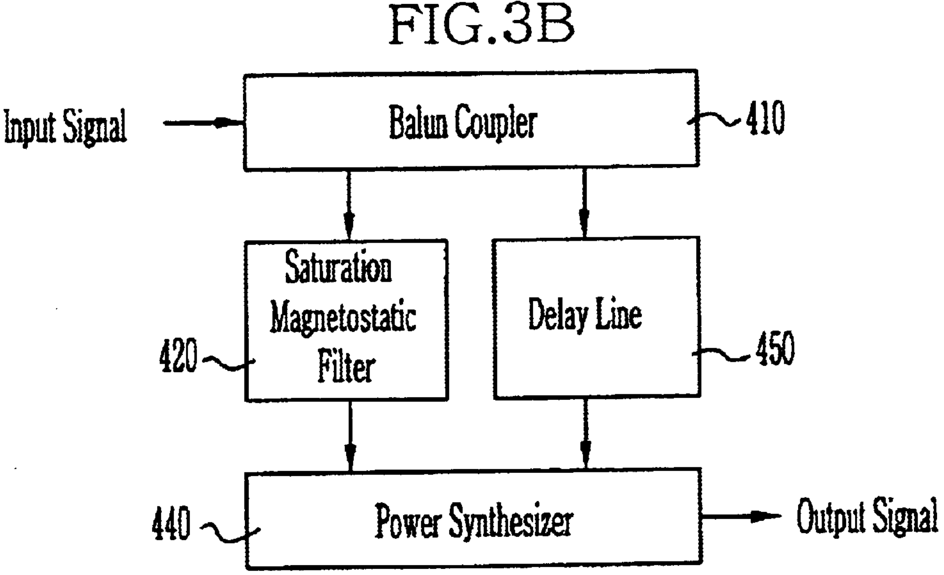
Figure 4:
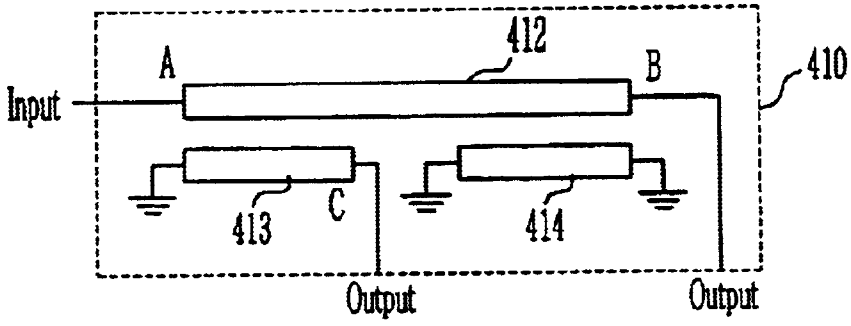

FIG. 3*a* is a schematic block diagram showing a S/N enhancer according to a first embodiment of the present invention;

FIG. 3*b* is a schematic block diagram showing a S/N enhancer according to a second embodiment of the present invention;

FIG. 4 shows an example of a balun coupler in FIGS. 3*a* and 3*b;*

Figure 5A:
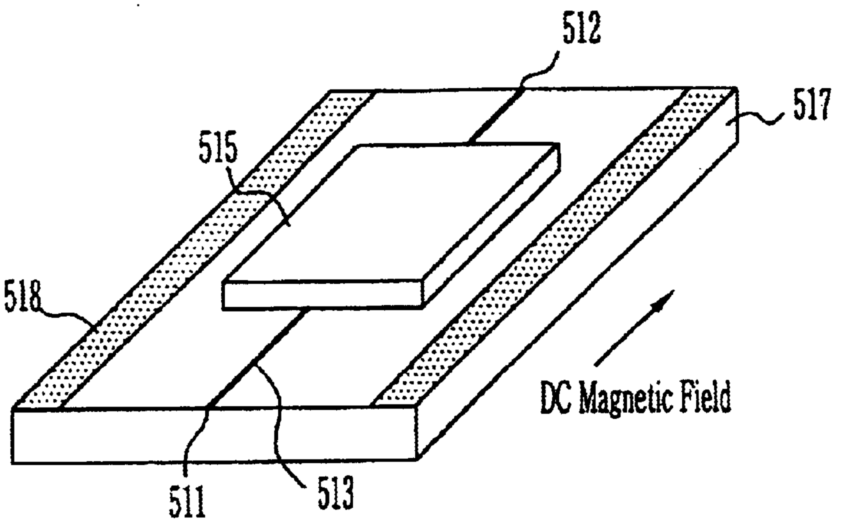

FIG. 5*a* shows an example of a magnetostatic wave filter in FIGS. 3*a* and 3*b;*

Figure 5B:
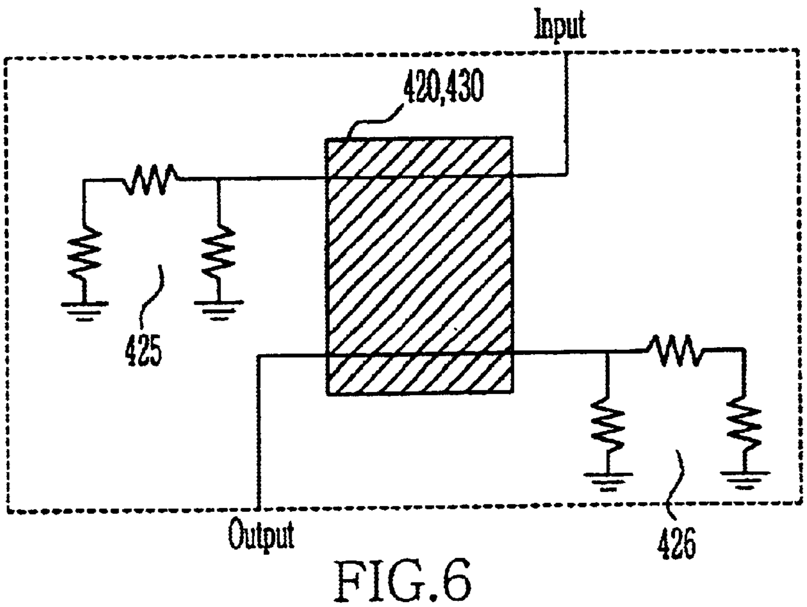
Figure 6:
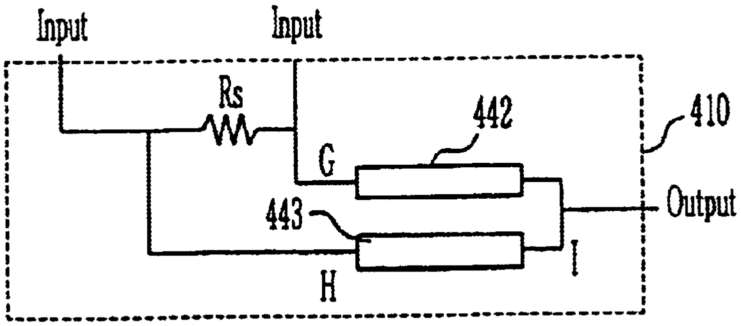

FIG. 5*b* shows the structure of the magnetostatic wave filter connected with attenuators; and FIG. 6 shows a power synthesizer in FIGS. 3*a* and 3*b*.

Similar reference characters refer to similar parts in the several views of the drawings.

DESCRIPTION OF THE PREFERRED EMBODIMENT

The embodiments of the present invention will be explained with reference to the accompanying drawings.

FIG. 3*a* is a schematic block diagram showing a S/N enhancer according to a first embodiment of the present invention. The S/N enhancer comprises a balun coupler 410, a saturation magnetostatic filter 420, a linear magnetostatic filter 430, and a power synthesizer 440.

The balun coupler 410 is the balance-to-unbalance transformer for receiving one input signal and outputting two output signals having a phase difference there between. Each of the two output signals is output as a balance signal or an unbalance signal by dividing into the power of the input signal at need. The balun coupler employed in the present invention is not limited to the specific embodiment if it can accomplish the above-mentioned function. For example, a merchant balun coupler using a micro-strip line has a broadband width and is implemented by a coaxial line shape or a plane shape. Hereinafter, the balun coupler 410 will be explained with reference to FIG. 4.

In FIG. 4, an example of the balun coupler 410 is shown. The balun coupler 410 has an input port A and two output ports B and C, wherein the two output signals thereof have a same power level and a phase difference of 180 degree. In addition, the balun coupler 410 further includes a Z1 transmission line 412, a Z2 transmission line 413, and a Z3 transmission line 414. Also, the Z1 transmission line 412, the Z2 transmission line 413, the Z3 transmission line 414 have $\lambda/2$, $\lambda/4$, the electrical length of the $\lambda/4$, and a characteristic impedance, respectively. Where, $\lambda$ means the wavelength of the propagated signal.

The input signal is input to the input port A of the Z1 transmission line 412 and the output signal is output at the output port B to be directed to the saturation magnetostatic wave filter 420 or the linear magnetostatic wave filter 430. The input port B of the Z2 transmission port 413 is grounded, and the output port thereof is connected to the saturation magnetostatic wave filter 420 or the linear magnetostatic wave filter 430 which is not connected with the output port B of the Z1 transmission line 412, so as to transmit the output signal. Also, the input port and the output port of the Z3 transmission line 414 are grounded to induce the coupling.

The transmission lines may be composed of, for example, a silver alloy, a copper, tungsten, or aluminum, may be formed by trimming at least a coil, or may be formed by trimming at least a capacitor. Also, the transmission lines are micro-strip type lines or strip-line type lines.

The magnetostatic wave filters 420, 430 convert the input signal such as a microwave signal to a magnetostatic wave signal, convert the magnetostatic wave signal into the signal having the shape of the input signal again, and output that.

The magnetostatic wave filters 420, 430 receive signal output from the balun coupler 410, respectively. The other words, the balance and unbalance signals are applied as the input signals of the saturation magnetostatic wave filter 420 and the linear magnetostatic wave filter 430, respectively. The saturation magnetostatic wave filter 420 saturates the energy of the converted magnetostatic wave signal such that the input/output characteristics thereof becomes non-linear, in case where the power level of the input signal is not less than a certain threshold value $P_{th1}$. Otherwise, the linear magnetostatic wave filter 430 converts the input signal into the magnetostatic wave signal having the energy proportional to the power level of the input signal, though the signal passing through the saturation magnetostatic wave filter 420 is saturated and converted to the magnetostatic wave signal. For example, the linear magnetostatic wave filter 430 is composed so as to have the saturation threshold value $P_{th2}$ larger than the saturation threshold value $P_{th1}$ of the saturation magnetostatic wave filter 420. Therefore, the range of the power level of the input signal passing through the saturation magnetostatic wave filter 420 can be adjusted the range from the values $P_{th1}$ to the values $P_{th2}$ such that the level of the input signal passing through the linear magnetostatic filter 430 can be not saturated. Hereinafter, the principle for embodying the S/N enhancer according to the present invention using the saturation phenomenon for converting the electromagnetic wave signal into the magnetostatic wave signal will be explained. In addition, each of the magnetostatic wave filters 420, 430 converts the converted magnetostatic wave signal into the microwave signal and outputs that.

Hereinafter, the example of the magnetostatic wave filter will be explained in detail with reference to FIG. 5*a*. For example, an Yttrium-Iron-Garnet film 515 is grown on a Gadolium-Galium-Garnet (GGG) substrate 517, a strip line 513 is formed on the dielectric substrate 517, and the both sides of the dielectric substrate 517 are formed with a magnetostatic wave absorber 518. When the input microwave signal is input at an input port 511 to be progressed to an output port 512, the input microwave signal is converted into the magnetostatic wave signal having the level proportional to the level of the input power while passing through the YIG film 515. Thereafter, the magnetostatic wave signal is oppositely converted into the microwave signal. When the microwave signal is converted into the magnetostatic wave signal, the magnetostatic wave filter maintains the linearity thereof until the power level of the microwave signal becomes the threshold value $P_{th}$, but has the input/output characteristics having the saturation characteristics when the power level of the microwave becomes larger than the threshold value Pth. Generally, the level of the threshold value $P_{th}$ can be adjusted by varying the characteristics of the YIG film, the shape of the strip line, the magnetic field strength. Accordingly, the saturation magnetostatic wave filter 420 and the linear magnetostatic wave filter 430 can be applied to the present embodiment by manufacturing each of the magnetostatic filters 420 and 430 such that the level of the threshold value $P_{th2}$ of the linear magnetostatic wave filter 430 becomes larger than that $P_{th1}$ of the saturation magnetostatic wave filter 420. However, above-mentioned implementation of the saturation magnetostatic wave filter 420 and the linear magnetostatic wave filter 430 was explained as an example.

On the other hand, the saturation magnetostatic filter 420 and the linear magnetostatic filter 430 in FIG. 5*a* may be connected with the attenuators 425, 426. The structure of the saturation magnetostatic filter 420 and the linear magnetostatic filter 430 connected with the attenuators 425 and 426 is shown in FIG. 5*b*.

The power synthesizer 440 synthesizes the powers of the signals output from the magnetostatic wave filters 420, 430. The kind of such 2:1 power synthesizer 440 is specially limited, and can be implemented, for example, by a Wilkinson power divider/synthesizer. The power synthesizer 440 of the present embodiment has two input ports and an output port, wherein the phase difference between the input signals is 180 degree the output port cancelled the signals having opposite phase each other and outputs the remaining signals. The power synthesizer 440 synthesizes three powers without varying the phase difference between the two input signals.

FIG. 6 shows an example of above-mentioned power synthesizer 440. The power synthesizer 440 has two input ports G and H and an output port I, wherein the two input signals are synthesized to output a synthesized signal. The power synthesize 440 further includes a Z4 transmission line 442 and a Z5 transmission line 443. Also, the Z4 transmission line 442 and the Z5 transmission line 443 have the electrical length of $\lambda/4$ and the characteristic impedance of ($\sqrt{}$ 2)Z0. Where, $\lambda$ means the wavelength of the propagated signal.

Hereinafter, the operation of the S/N enhancer according to the first embodiment will be described.

First, when an input signal is input to the balun coupler 410, the balun coupler 410 divides the input signal into two balance and unbalance output signals which the powers thereof are a half of that of the input signal and the phases difference there between is 180 degree and outputs them to the saturation magnetostatic wave filter 420 and the linear magnetostatic wave filter 430. At this time, the correspondence of the saturation magnetostatic wave filter 420 and the linear magnetostatic wave filter 430 for the balance and unbalance output signals may be changed.

Next, in case where the level of the input signal is less than a certain value (the threshold value of the saturation magnetostatic wave filter 420), the signals having a power level which can be judged as the noise are input to the saturation magnetostatic wave filter 420 and the linear magnetostatic wave filter 430, and these two signals are converted into the magnetostatic wave signals having the similar energy in the saturation magnetostatic wave filter 420 and the linear magnetostatic wave filter 430, and then the converted magnetostatic wave signals are oppositely converted into the microwave signals again, thereby the signals having same size and the phase difference of 180 degree are output. Thereafter, these two signals output from the magnetostatic wave filters are synthesized in the power synthesizer 440, thereby the signal is not output at the output port. The reason is because these signals have same size and opposite phase to be cancelled each other.

Next, in case where the level of the input signal is not less than the certain value (the threshold value of the saturation magnetostatic wave filter 420), since the signal input to the saturation magnetostatic wave filter 420 is not less than the saturation value, the energy of the converted the magnetostatic wave signal is saturated to do not exceed the certain value, but, in the linear magnetostatic wave filter 430, the signal is converted to the magnetostatic wave signal having the energy proportional to the power of the input signal. Accordingly, when these signals are oppositely converted again, the signals having different power and the phase difference of 180 degree are output. Thereafter, the these two signals output from the magnetostatic wave filters are synthesized in the power synthesizer 440 to output the synthesized signal, wherein the synthesized signal has mainly the power of the signal passing through the linear magnetostatic wave filter 430.

By the above-mentioned manner, the S/N enhancer that the loss in the small signal (noise) is higher than the loss in the large signal can be accomplished. By the above-mentioned manner, the S/N enhancer that can be miniaturized, can be matched with an external circuit in impedance, and can be applicable to a system using the high power or the low power, because the phase shifter is not used. Also, since the S/N enhancer according to the first embodiment can be implemented by one chip shape, it is advantageous to mass production.

Hereinafter, the second embodiment according to the present invention will be described.

FIG. 3*b* shows the structure of the S/N enhancer according to the second embodiment of the present invention. The S/N enhancer includes a balun coupler 410, a saturation magnetostatic wave filter 420, a delay line 450, and a power synthesizer 440.

While the linear magnetostatic wave filter is employed in the first embodiment, the delay line 450 is employed in the second embodiment. That is, while the linear magnetostatic wave filter in the first embodiment converts the signal into the magnetostatic wave signal having the energy proportional to the power of the input signal and oppositely converts the converted signal into the microwave signal again, the delay line 450 in the second embodiment transmits the input power to the power synthesizer 440, maintaining the linearity thereof. Since the principle thereof is equal to that of the first embodiment, the explanation thereof will be omitted.

The above-mentioned S/N enhancer improves the S/N ratio of the digital images thereby the images having good quality can be received.

According the present invention, the small-sized S/N enhancer that can be readily matched with an external circuit in impedance, used at a low power, and applied to a broadband system can be provided.

In addition, since the distinction of the images in the multimedia communication system such as a digital television and a camera can be improved, the S/N ratio of the digital imaged, thereby the images having good quality can be received.

Although the present invention has been illustrated and described with respect to exemplary embodiments thereof, the present invention should not be understood as limited to the specific embodiment, and it should be understood by those skilled in the art that the foregoing and various other changes, omission and additions may be made therein and thereto, without departing from the spirit and scope of the present invention.

What is claimed is:

1. A S/N enhancer comprising:

a balun coupler for dividing an input signal into first and second signals having the same power, the second signal having the phase difference of 180 degree with respect to the first signal;

a saturation magnetostatic wave filter for receiving the first signal output from said balun coupler, converting that into a magnetostatic wave signal, and oppositely converting the magnetostatic wave signal, wherein the power of the magnetostatic wave signal is saturated if the first signal has the power of equal to and more than that of a noise signal;

a linear magnetostatic wave filter for receiving the second signal from said balun coupler, converting that into a magnetostatic wave signal, and oppositely converting the magnetostatic wave signal, wherein the received second signal is converted into the magnetostatic wave signal having an energy linear to the power of the input signal; and a power synthesizer for synthesizing the respective signals output from said saturation magnetostatic wave filter and said linear magnetostatic wave filter.

2. The S/N enhancer according to claim 1, wherein said power synthesizer is composed of a Wilkinson power synthesizer.

3. The S/N enhancer according to claim 1, wherein the saturation threshold value of said linear magnetostatic wave filter is larger than that of said saturation magnetostatic wave filter.

4. The S/N enhancer according to claim 1, wherein said linear magnetostatic wave filter and said saturation magnetostatic wave filter includes an attenuator connected to at least one of the input port and the output port thereof, respectively.

5. The S/N enhancer according to claim 1, wherein said saturation magnetostatic wave filter includes a dielectric substrate; a strip line formed on said dielectric substrate for inputting and outputting the signal; a Yittrium-Iron-Gamet film formed on said dielectric substrate and said strip line, for converting the first signal into the magnetostatic wave signal; and a magnetostatic absorber formed on both sides of said dielectric substrate, for absorbing the magnetostatic wave signal.

* * * * *